(12) United States Patent
Pletcher et al.

(10) Patent No.: US 8,779,857 B2
(45) Date of Patent: Jul. 15, 2014

(54) AMPLIFIER WITH VARIABLE MATCHING CIRCUIT TO IMPROVE LINEARITY

(75) Inventors: Nathan M. Pletcher, San Diego, CA (US); Yu Zhao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 9 days.

(21) Appl. No.: 12/699,659

(22) Filed: Feb. 3, 2010

(65) Prior Publication Data
US 2011/0037519 A1 Feb. 17, 2011

Related U.S. Application Data

(60) Provisional application No. 61/234,223, filed on Aug. 14, 2009.

(51) Int. Cl.
*H03F 3/191* (2006.01)

(52) U.S. Cl.
USPC ........................................... 330/302; 330/310

(58) Field of Classification Search
USPC .................... 330/302, 310, 136, 305, 98, 150
See application file for complete search history.

(56) References Cited

U.S. PATENT DOCUMENTS

| | | | | |
|---|---|---|---|---|
| 3,434,070 | A | * | 3/1969 | Bartnik et al. ................ 330/305 |
| 5,252,929 | A | | 10/1993 | Taroumaru |
| 5,343,172 | A | | 8/1994 | Utsu et al. |
| 5,479,132 | A | * | 12/1995 | Verhaeghe et al. ............ 327/553 |
| 5,673,001 | A | * | 9/1997 | Kim et al. ..................... 330/284 |
| 5,977,834 | A | * | 11/1999 | Davis et al. .................... 330/302 |
| 6,075,414 | A | | 6/2000 | Nagaoka et al. |
| 6,087,896 | A | | 7/2000 | Bazzani |
| 6,166,604 | A | | 12/2000 | Matsunaga |
| 6,255,885 | B1 | | 7/2001 | Brandt |
| 6,414,562 | B1 | | 7/2002 | Bouisse et al. |

(Continued)

FOREIGN PATENT DOCUMENTS

| CN | 101095280 A | 12/2007 |
|---|---|---|
| GB | 2443930 | 5/2008 |

(Continued)

OTHER PUBLICATIONS

Chengzhou Wang; Vaidyanathan, M.; Larson, L.E.; "A capacitance-compensation technique for improved linearity in CMOS class-AB power amplifiers", Solid-State Circuits, IEEE Journal of; vol. 39, Issue 11, Nov. 2004 pp. 1927-1937.
International Search Report and Written Opinion—PCT/US2010/045652, International Search Authority—European Patent Office—Dec. 8, 2010.
Malmqvist R, et al., "RF MEMS and GaAs Based Reconfigurable RF Front-End Components for Wide-Band Multi-Functional Phased Arrays" Radar Conference, 2006. 3rd European, IEEE, PI , Sep. 1, 2006, pp. 319-322, XP031006049.
Wang C, et al., "A Nonlinear Capacitance Cancellation Technique and its Application to a CMOS Class AB Power Amplifier," Radio Frequency Integrated Circuits(RFIC) Symposium 2001,Digest of Papers, U.S., IEEE, May 2001, pp. 39-42.

*Primary Examiner* — Khanh V Nguyen
(74) *Attorney, Agent, or Firm* — Ramin Mobarhan

(57) ABSTRACT

Techniques for reducing distortion and improving linearity of amplifiers are described. In an exemplary design, an apparatus includes a driver amplifier, a variable matching circuit, and a power amplifier. The driver amplifier amplifies a first RF signal and provides a second RF signal. The variable matching circuit receives the second RF signal and provides a third RF signal. The power amplifier amplifies the third RF signal and provides a fourth RF signal. The variable matching circuit matches a fixed impedance at the output of the driver amplifier to a variable impedance at the input of the power amplifier in order to improve the linearity of the amplifiers. In an exemplary design, the power amplifier includes a first transistor (e.g., an NMOS transistor) of a first type, and the variable matching circuit includes a second transistor (e.g., a PMOS transistor) of a second type that is different from the first type.

22 Claims, 8 Drawing Sheets

(56) References Cited

U.S. PATENT DOCUMENTS

| | | | |
|---|---|---|---|
| 6,437,649 B2 * | 8/2002 | Miyashita et al. | 330/302 |
| 6,657,497 B1 * | 12/2003 | Yang et al. | 330/302 |
| 7,151,411 B2 * | 12/2006 | Martin et al. | 330/305 |
| 7,495,515 B1 | 2/2009 | Branch et al. | |
| 7,567,782 B2 * | 7/2009 | Liu et al. | 455/121 |
| 2001/0045867 A1 | 11/2001 | Miyashita et al. | |
| 2005/0030094 A1 | 2/2005 | Conrad et al. | |
| 2005/0130608 A1 | 6/2005 | Forse et al. | |
| 2005/0242881 A1 | 11/2005 | Redman-White et al. | |
| 2007/0182485 A1 | 8/2007 | Ko | |
| 2009/0066439 A1 | 3/2009 | Whelan et al. | |
| 2010/0026393 A1 * | 2/2010 | Keerti et al. | 330/302 |

FOREIGN PATENT DOCUMENTS

| | | |
|---|---|---|
| JP | H0440702 A | 2/1992 |
| JP | H04257104 A | 9/1992 |
| WO | WO0163795 A1 | 8/2001 |
| WO | 2008014029 A2 | 1/2008 |

\* cited by examiner

AMPLIFIER WITH VARIABLE MATCHING CIRCUIT TO IMPROVE LINEARITY

CLAIM OF PRIORITY UNDER 35 U.S.C. §119

The present application for patent claims priority to Provisional U.S. Application Ser. No. 61/234,223, entitled "NON-LINEAR CAPACITANCE IN PA INPUT MATCHING NETWORK TO IMPROVE LINEARITY," filed Aug. 14, 2009, assigned to the assignee hereof, and expressly incorporated herein by reference.

BACKGROUND

I. Field

The present disclosure relates generally to electronics, and more specifically to amplifiers.

II. Background

Amplifiers are commonly used in various electronic devices to provide signal amplification. Different types of amplifiers are available for different uses. For example, a wireless communication device such as a cellular phone may include a transmitter and a receiver for bi-directional communication. The transmitter may include a driver amplifier (DA) and a power amplifier (PA), the receiver may include a low noise amplifier (LNA), and the transmitter and receiver may include variable gain amplifiers (VGAs).

A power amplifier may be used to amplify an input radio frequency (RF) signal and provide an output RF signal suitable for transmission. The power amplifier may be designed with large transistors to provide high output power. Large transistors typically have large nonlinear input capacitance, which may result in distortion being generated by the power amplifier. The distortion may degrade the performance of the power amplifier. A power amplifier with less distortion may be highly desirable.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Techniques for reducing distortion and improving linearity of amplifiers are described herein. The techniques may be used for various types of amplifiers such as power amplifiers, driver amplifiers, LNAs, VGAs, etc. The techniques may also be used for amplifiers in various electronic devices such as wireless communication devices, cellular phones, personal digital assistants (PDAs), handheld devices, wireless modems, laptop computers, cordless phones, Bluetooth devices, consumer electronic devices, etc. For clarity, the use of the techniques for amplifiers in a wireless communication device is described below.

Figure 1:
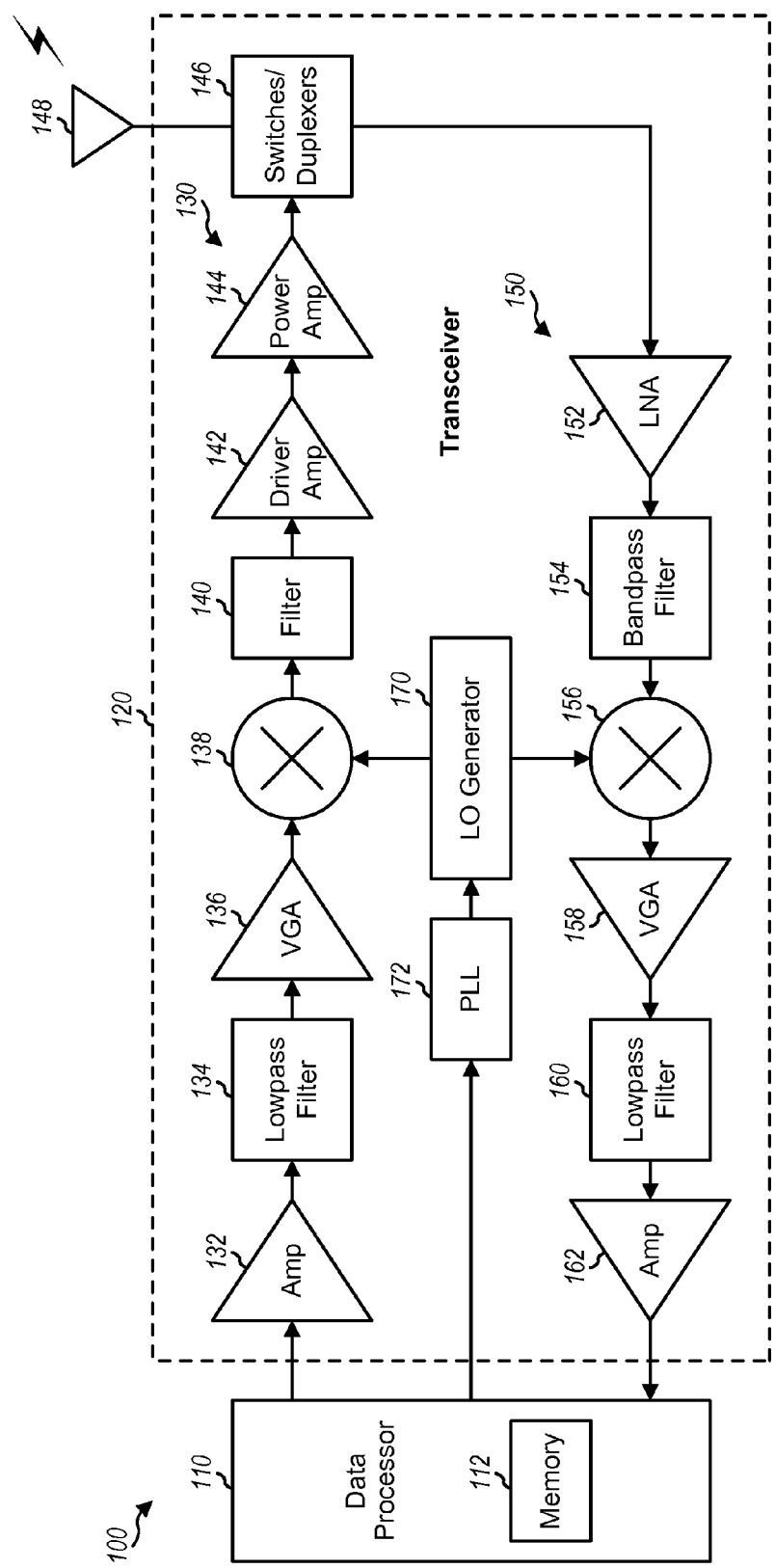
FIG. 1 shows a block diagram of a wireless communication device.

FIG. 1 shows a block diagram of an exemplary design of a wireless communication device 100. In this exemplary design, wireless device 100 includes a data processor 110 and a transceiver 120. Transceiver 120 includes a transmitter 130 and a receiver 150 that support bi-directional wireless communication. In general, wireless device 100 may include any number of transmitters and any number of receivers for any number of communication systems and any number of frequency bands.

In the transmit path, data processor 110 processes data to be transmitted and provides an analog output signal to transmitter 130. Within transmitter 130, the analog output signal is amplified by an amplifier (Amp) 132, filtered by a lowpass filter 134 to remove images caused by digital-to-analog conversion, amplified by a VGA 136, and upconverted from baseband to RF by a mixer 138. The upconverted signal is filtered by a filter 140 to remove images caused by the frequency upconversion, further amplified by a driver amplifier 142 and a power amplifier 144, routed through switches/duplexers 146, and transmitted via an antenna 148.

In the receive path, antenna 148 receives signals from base stations and/or other transmitter stations and provides a received signal, which is routed through switches/duplexers 146 and provided to receiver 150. Within receiver 150, the received signal is amplified by an LNA 152, filtered by a bandpass filter 154, and downconverted from RF to baseband by a mixer 156. The downconverted signal is amplified by a VGA 158, filtered by a lowpass filter 160, and amplified by an amplifier 162 to obtain an analog input signal, which is provided to data processor 110.

FIG. 1 shows transmitter 130 and receiver 150 implementing a direct-conversion architecture, which frequency converts a signal between RF and baseband in one stage. Transmitter 130 and/or receiver 150 may also implement a superheterodyne architecture, which frequency converts a signal between RF and baseband in multiple stages. A local oscillator (LO) generator 170 generates and provides transmit and receive LO signals to mixers 138 and 156, respectively. A phase locked loop (PLL) 172 receives control information from data processor 110 and provides control signals to LO generator 170 to generate the transmit and receive LO signals at the proper frequencies.

FIG. 1 shows an exemplary transceiver design. In general, the conditioning of the signals in transmitter 130 and receiver 150 may be performed by one or more stages of amplifier, filter, mixer, etc. These circuit blocks may be arranged differently from the configuration shown in FIG. 1. Furthermore, other circuit blocks not shown in FIG. 1 may also be used in the transmitter and receiver. For example, matching circuits may be used to match various active circuits in FIG. 1. Some circuit blocks in FIG. 1 may also be omitted. All or a portion of transceiver 120 may be implemented on an analog integrated circuit (IC), an RF IC (RFIC), a mixed-signal IC, etc. For example, amplifier 132 through power amplifier 144 in transmitter 130 may be implemented on an RFIC. Driver amplifier 142 and power amplifier 144 may also be implemented on another IC external to the RFIC.

Data processor 110 may perform various functions for wireless device 100, e.g., processing for transmitted and received data. A memory 112 may store program codes and data for data processor 110. Data processor 110 may be implemented on one or more application specific integrated circuits (ASICs) and/or other ICs.

The techniques described herein for reducing distortion and improving linearity of amplifiers may be used for various types of amplifiers, such as the amplifiers shown in FIG. 1. For clarity, much of the description below covers a power amplifier, e.g., power amplifier 144 in FIG. 1.

Figure 2:
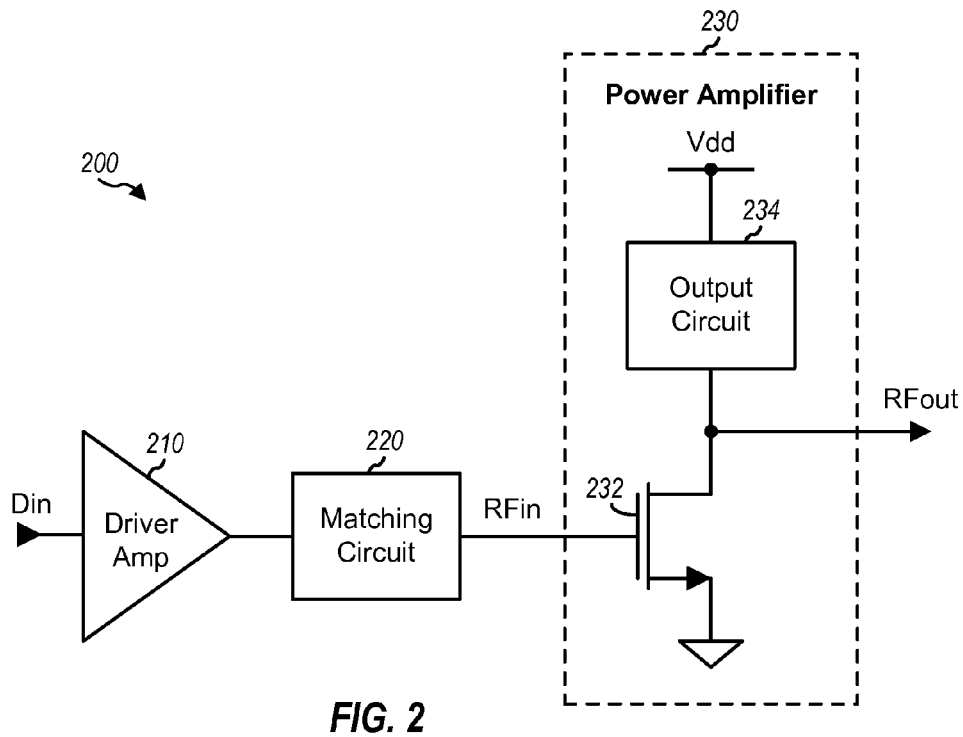
FIG. 2 shows an exemplary power amplifier (PA) module.

FIG. 2 shows a schematic diagram of an exemplary design of a PA module 200, which may be use for driver amplifier 142 and power amplifier 144 in FIG. 1. PA module 200 includes a driver amplifier 210, a matching circuit 220, and a power amplifier 230. Driver amplifier 210 receives and amplifies an incoming RF signal (Din) and provides an amplified RF signal. Matching circuit 220 receives the amplified RF signal and provides an input RF signal (RFin) to power amplifier 230. Matching circuit 220 performs impedance matching between a first impedance at the output of driver amplifier 210 and a second impedance at the input of power amplifier 230. Power amplifier 230 receives and amplifies the RFin signal and provides an output RF signal (RFout).

In the exemplary design shown in FIG. 2, power amplifier 230 includes an N-channel metal oxide semiconductor (NMOS) transistor 232 and an output circuit 234. NMOS transistor 232 has its source coupled to circuit ground, its gate acting as an input of power amplifier 230, and its drain providing the RFout signal. Output circuit 234 has one end coupled to an upper power supply (Vdd) and the other end coupled to the drain of NMOS transistor 232. Output circuit 234 may include a load comprising one or more inductors, capacitors, MOS transistors, etc. Output circuit 234 may also include one or more NMOS transistors coupled in a stack with NMOS transistor 232. In this case, the RFout signal may be provided by the topmost NMOS transistor in the stack. Stacked NMOS transistors may be used to split a large voltage swing of the RFout signal, so that each NMOS transistor observes only a fraction of the voltage swing. This may improve reliability, especially if the NMOS transistors are fabricated with deep sub-micron IC processes and have low breakdown voltages.

NMOS transistor 232 may be a large transistor in order to provide high output power for the RFout signal. For example, NMOS transistor 232 may be required to provide +33 dBm output power for Global System for Mobile Communications (GSM) or +27 dBm output power for Code Division Multiple Access (CDMA). A large NMOS transistor may have large input capacitance.

Figure 4:
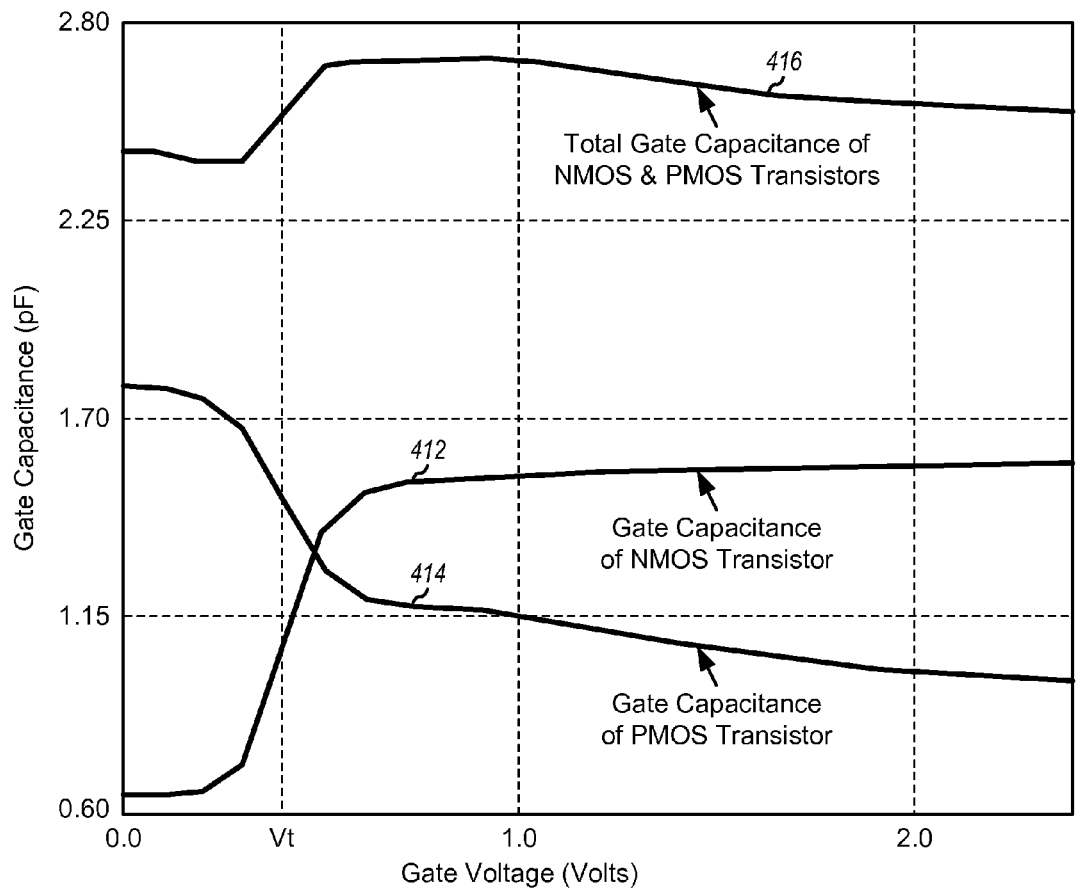
FIG. 4 shows input capacitance versus gate voltage for two different transistors.

FIG. 4 shows an exemplary plot 412 of input/gate capacitance versus gate voltage of NMOS transistor 232 in FIG. 2. In FIG. 4, the horizontal axis denotes the gate voltage of NMOS transistor 232, and the vertical axis denotes input capacitance of NMOS transistor 232. As shown in FIG. 4, the input capacitance of NMOS transistor 232 is low at low gate voltage, abruptly increases near a threshold voltage (Vt), and is high at high gate voltage greater than the threshold voltage. A threshold voltage is a voltage at which a transistor starts to turn on.

Power amplifier 230 may be biased near the threshold voltage in order to obtain high efficiency. However, as shown in FIG. 4, the input capacitance of NMOS transistor 232 may be most nonlinear near the threshold voltage. The nonlinear input capacitance of NMOS transistor 232 may result in distortion, which may adversely impact the linearity of power amplifier 230.

Figure 3:
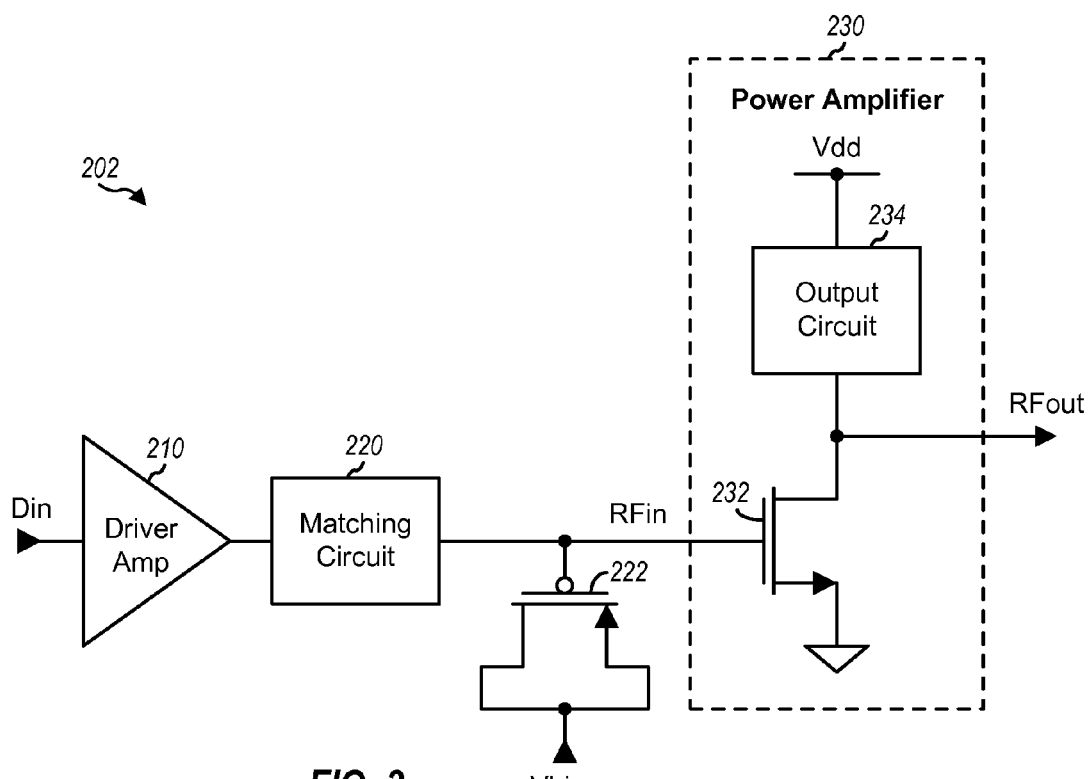
FIG. 3 shows an exemplary PA module with compensation for PA input capacitance.

FIG. 3 shows a schematic diagram of an exemplary design of a PA module 202 with compensation for PA input capacitance. PA module 202 includes driver amplifier 210, matching circuit 220, and power amplifier 230 in PA module 200 in FIG. 2. PA module 202 further includes a P-channel metal oxide semiconductor (PMOS) transistor 222, which is used to compensate for the nonlinear input capacitance of NMOS transistor 232 in power amplifier 230. PMOS transistor 222 has its gate coupled to the gate of NMOS transistor 232 and its source and drain coupled together and receiving a bias voltage (Vbias).

FIG. 4 shows an exemplary plot 414 of input/gate capacitance versus gate voltage of PMOS transistor 222 in FIG. 4. As shown in FIG. 4, the input capacitance of PMOS transistor 222 is high at low gate voltage, decreases quickly near the threshold voltage, and is low at high gate voltage greater than the threshold voltage. PMOS transistor 222 has a capacitance-to-voltage (CV) curve that is approximately reversed of the CV curve for NMOS transistor 232.

FIG. 4 also shows an exemplary plot 416 of the total input/gate capacitance of power amplifier 230, which is the sum of the input capacitance of NMOS transistor 232 and the input capacitance of PMOS transistor 222. As shown in FIG. 4, the total input capacitance has much less variation across gate voltage than the input capacitance of NMOS transistor 232. The use of PMOS transistor 222 may thus result in less distortion generated by power amplifier 230. However, PMOS transistor 222 may increase the total input capacitance of power amplifier 230 by a factor of two. The higher total input capacitance of power amplifier 230 may increase the quality factor (Q) of matching circuit 220, may require more power from driver amplifier 210, and may increase circuit area.

Figure 5:
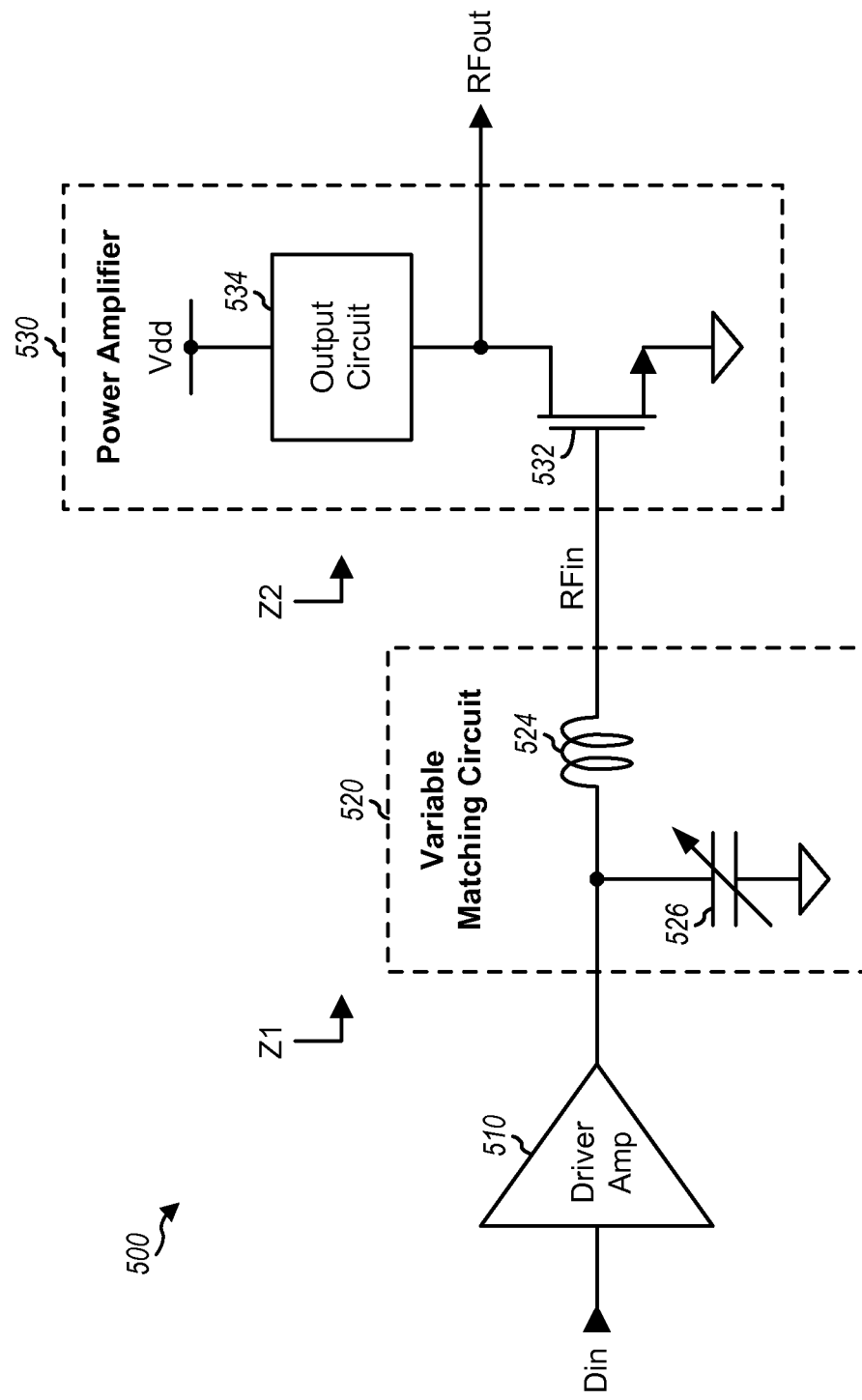
FIGS. 5 and 6 show two exemplary PA modules with variable input impedance matching to compensate for PA input capacitance.

FIG. 5 shows a schematic diagram of an exemplary design of a PA module 500 with variable input impedance matching to compensate for PA input capacitance. PA module 500 includes a driver amplifier 510, a variable matching circuit 520, and a power amplifier 530. Driver amplifier 510 receives and amplifies an incoming RF (Din) signal and provides an amplified RF signal. Matching circuit 520 receives the amplified RF signal and provides an RFin signal to power amplifier 530. Matching circuit 520 performs impedance matching between a first impedance (Z1) at the output of driver amplifier 510 and a second impedance (Z2) at the input of power amplifier 530. Power amplifier 530 receives and amplifies the RFin signal from matching circuit 520 and provides an RFout signal.

In the exemplary design shown in FIG. 5, power amplifier 530 includes an NMOS transistor 532 and an output circuit 534, which are coupled in similar manner as NMOS transistor 232 and output circuit 234 in FIG. 2. In other exemplary designs, power amplifier 530 may include a PMOS transistor or some other type of transistor (instead of NMOS transistor 532) for an input transistor.

In the exemplary design shown in FIG. 5, matching circuit 520 includes an inductor 524 and a variable capacitor 526. Inductor 524 has one end coupled to the input of matching circuit 520 and the other end coupled to the output of matching circuit 520. Capacitor 526 has one end coupled to the input of matching circuit 520 and the other end coupled to circuit/AC ground. FIG. 5 shows an exemplary topology for matching circuit 520, which includes a series inductor and a shunt input capacitor. Matching circuit 520 may also be implemented with other topologies.

The Z1 impedance at the output of driver amplifier 510 may have a fixed target value, which may be approximately 25 Ohms (Ω) or some other value. The Z2 impedance at the input of power amplifier 530 may have a low nominal value (e.g., 4 Ohms or lower) with a nominal bias voltage for the gate of NMOS transistor 532. The Z2 impedance may have a variable value due to the nonlinear input capacitance of NMOS transistor 532. Matching circuit 520 may attempt to match the fixed Z1 impedance to the variable Z2 impedance in order to improve the linearity of driver amplifier 510 and power amplifier 530.

Figure 6:
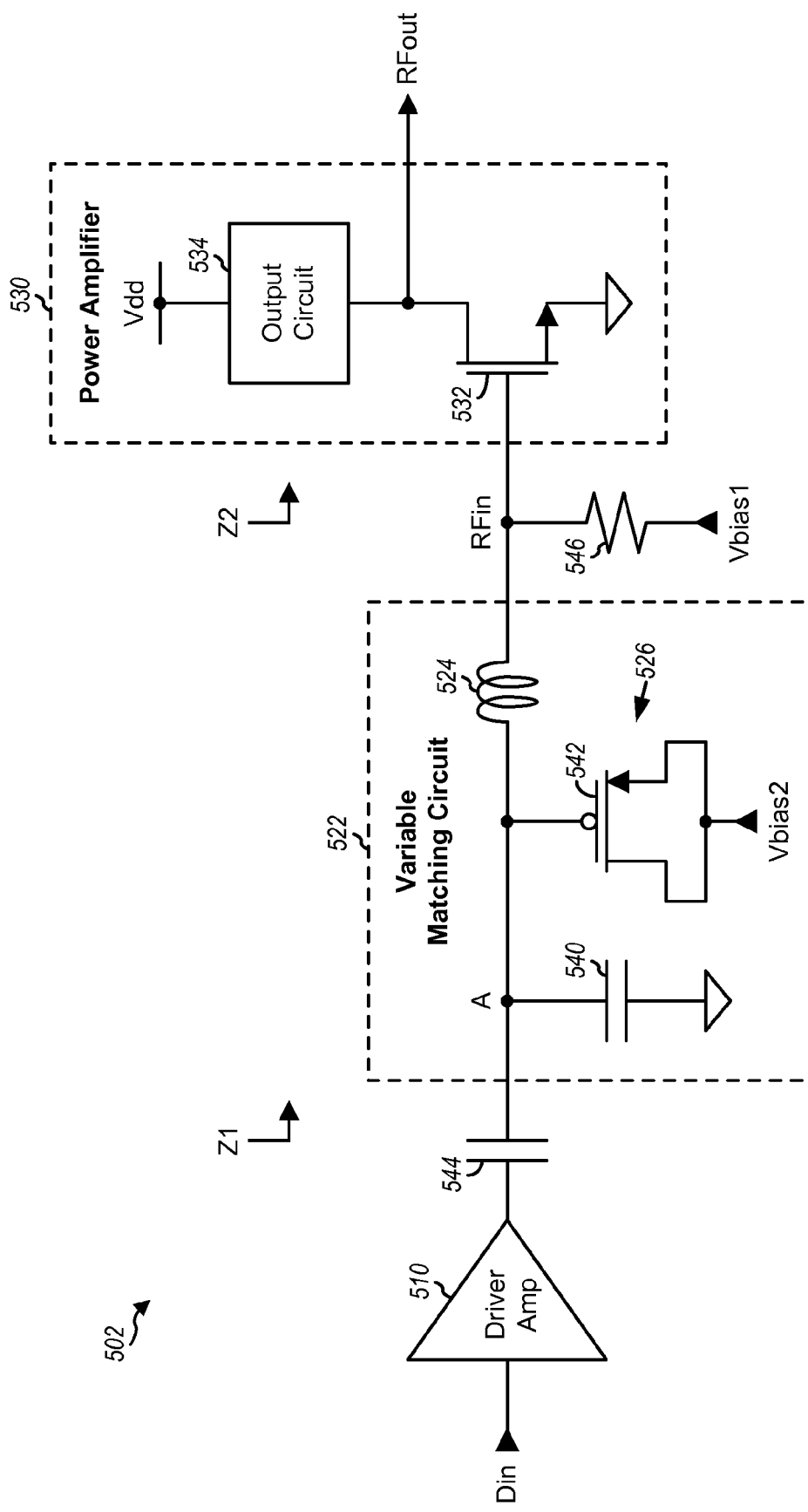

FIG. 6 shows a schematic diagram of an exemplary design of a PA module 502 with variable input impedance matching. PA module 502 includes driver amplifier 510, a variable matching circuit 522, and power amplifier 530. Matching circuit 522 is an exemplary design of matching circuit 520 in FIG. 5 and includes series inductor 524 and shunt variable capacitor 526. Inductor 524 has one end coupled to the input of matching circuit 522 (which is node A) and the other end coupled to the output of matching circuit 522. Variable capacitor 526 is implemented with a fixed capacitor 540 coupled in parallel with a PMOS transistor 542. Capacitor 540 has one end coupled to node A and the other end coupled to circuit/AC ground. PMOS transistor 542 has its gate coupled to node A and its source and drain coupled together and receiving a Vbias2 voltage.

An AC-coupling capacitor 544 has one end coupled to the output of driver amplifier 510 and the other end coupled to the input of matching circuit 522. A resistor 546 has one end coupled to the gate of NMOS transistor 532 and the other end receiving a Vbias1 voltage. Capacitor 544 is an AC-coupling/DC-blocking capacitor that isolates the DC voltage at node A and the DC voltage at the output of driver amplifier 510. Resistor 546 provides a bias voltage of Vbias1 to the gate of NMOS transistor 532 and also to node A via inductor 524. Inductor 524 and capacitor 526 provide impedance matching between the fixed Z1 impedance at the output of driver amplifier 510 and the variable Z2 impedance at the input of power amplifier 530.

For the exemplary design shown in FIG. 6, the total capacitance ($C_{TOTAL}$) of variable capacitor 526 may be expressed as:

$$C_{TOTAL} = C_{FIXED} + C_{VAR}, \quad \text{Eq (1)}$$

where $C_{FIXED}$ is the capacitance of fixed capacitor 540, and $C_{VAR}$ is the capacitance of PMOS transistor 542.

Variable capacitor 526 may be designed to have a suitable range of capacitance values that can compensate for the nonlinear input capacitance of NMOS transistor 532. This range of capacitance values may be obtained by selecting a suitable $C_{FIXED}$ value for capacitor 540 and a suitable range of $C_{VAR}$ values for PMOS transistor 542. The desired range of $C_{VAR}$ values may be obtained by (i) designing PMOS transistor 542 with a suitable size and (ii) selecting a suitable Vbias2 voltage for PMOS transistor 542 relative to the Vbias1 voltage for NMOS transistor 532.

Figure 7:
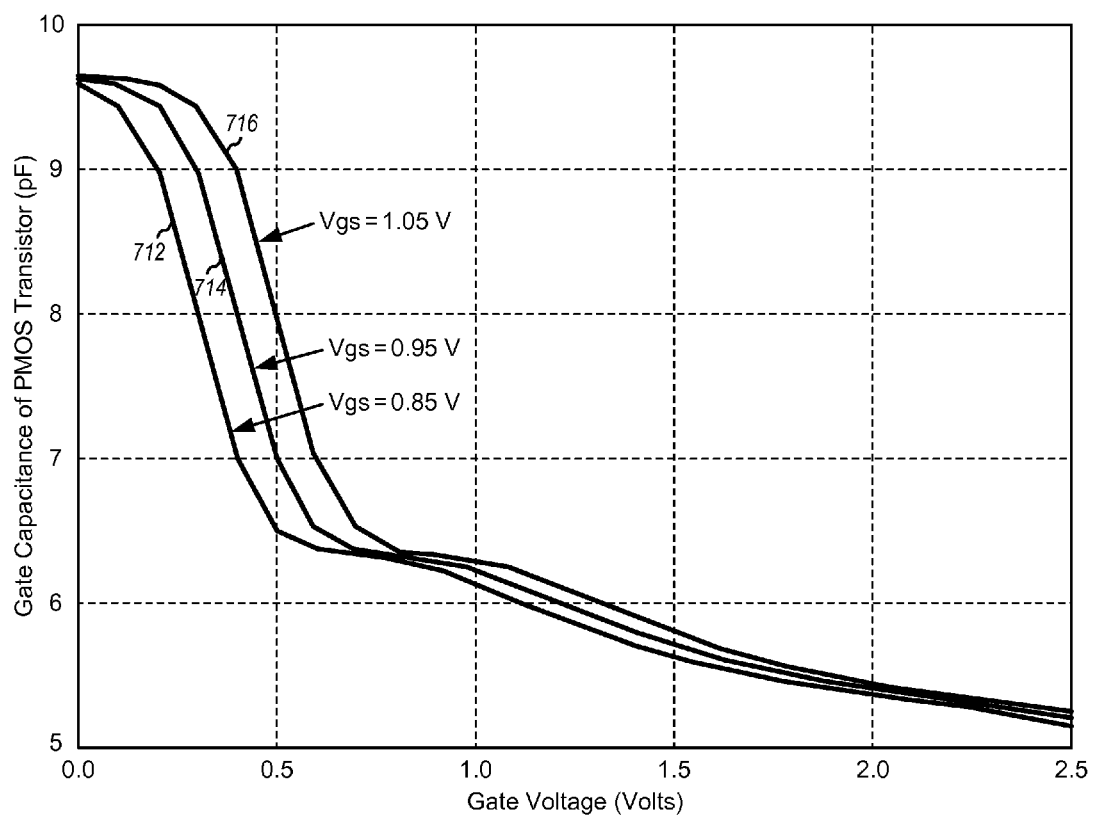
FIG. 7 shows input capacitance versus gate voltage for different bias voltages.

FIG. 7 shows exemplary plots of input/gate capacitance versus gate voltage of PMOS transistor 542 in FIG. 6 for different Vbias2 voltages. In FIG. 7, the horizontal axis denotes the gate voltage of NMOS transistor 532. The vertical axis denotes the input/gate capacitance of PMOS transistor 542. The gate voltage of PMOS transistor 542 is set to the Vbias1 voltage. The source voltage of PMOS transistor 542 is set to the Vbias2 voltage. A gate-to-source voltage (Vgs) of PMOS transistor 542 may be varied by changing the Vbias2 voltage relative to the Vbias1 voltage.

FIG. 7 shows plots 712, 714 and 716 for the gate capacitance of PMOS transistor 542 with Vgs voltages of 0.85, 0.95 and 1.05 Volts (V), respectively. As shown in FIG. 7, plots 712, 714 and 716 have similar shape and are essentially shifted versions of one another. In particular, plot 712 for Vgs voltage of 0.85V may be shifted to the right (i) by 0.1V to obtain plot 714 for Vgs voltage of 0.95V or (ii) by 0.2V to obtain plot 716 for Vgs voltage of 1.05V.

Two degrees of freedom may be available to obtain the desired compensation for the nonlinear input capacitance of NMOS transistor 532. For the first degree of freedom, a suitable ratio of $C_{FIXED}$ to nominal $C_{VAR}$ may be selected. For example, capacitor 540 may be designed to have a $C_{FIXED}$ value of approximately 20 pico-Farad (pF), and PMOS transistor 542 may be designed to have a nominal $C_{VAR}$ value of approximately 8 pF. Other values may also be selected for capacitor 540 and PMOS transistor 542. The nominal $C_{VAR}$ value may be defined with a nominal Vbias1 voltage applied at the gate of PMOS transistor 542 and zero Volts applied at the source of PMOS transistor 542. The nominal $C_{VAR}$ value may be obtained with an appropriate size for PMOS transistor 542. For the second degree of freedom, the Vbias2 voltage of PMOS transistor 542 may be varied relative to the Vbias1 voltage for NMOS transistor 532. This may then change the output power level at which compensation is triggered. The Vbias2 voltage may be set to a suitable value, which may be determined by calibration performed during manufacturing and/or measurements made during normal operation.

In an exemplary design, variable matching circuit 522 in FIG. 6 may automatically compensate for the nonlinear input capacitance of NMOS transistor 532 in power amplifier 530. The input capacitance of NMOS transistor 532 may vary versus power level of the RFin signal, e.g., may increase at higher power level and decrease at lower power level. The gate of PMOS transistor 542 may observe the RFin signal provided to NMOS transistor 532. The input capacitance of PMOS transistor 542 may then vary versus power level of the RFin signal, e.g., may decrease at higher power level and increase at lower power level. The impedance matching by matching circuit 522 may thus vary automatically with power level to compensate for changes in the input capacitance of NMOS transistor 532 with power level. Matching circuit 522 may perform compensation in an open loop manner without requiring any additional control.

In another exemplary design, variable matching circuit 522 may be controlled to compensate for nonlinear input capacitance of NMOS transistor 532. A control signal indicative of changes in the input capacitance of NMOS transistor 532 may be generated. For example, the power level of the RFin or RFout signal may be measured (e.g., with a power detector) or may be computed (e.g., digitally). The measured power level may be used to generate the control signal, e.g., using a look-up table or some other function. Matching circuit 522 may then be controlled based on the control signal. For example, the control signal may be used as the Vbias2 voltage for PMOS transistor 532 or may be applied in other manners FIG. 6 shows an exemplary design of variable matching circuit 522, which can match a fixed Z1 impedance to a variable Z2 impedance due to nonlinear PA input capacitance. A variable matching circuit that can compensate for nonlinear PA input capacitance may also be implemented in other manners. In another exemplary design, variable capacitor 526 may be implemented with fixed capacitor 540 and PMOS transistor 542 coupled in series (instead of in parallel as shown in FIG. 6). In this exemplary design, capacitor 540 may have one input coupled to node A and the other input coupled to the gate of PMOS transistor 542. The source and drain of PMOS transistor 542 may be coupled to circuit/AC ground, and the Vbias2 voltage may be applied to the gate of PMOS transistor 542. In another exemplary design, variable capacitor 526 may be implemented with only PMOS transistor 542, and fixed capacitor 540 may be omitted. A variable matching circuit may also be implemented in other manners. A variable matching circuit may be implemented with a variable capacitor having a CV curve that may be approximately reversed of a CV curve of the input capacitance of a power amplifier.

Variable matching circuit 522 may reduce distortion and improve linearity of driver amplifier 510 and power amplifier 530. Linearity may be quantified by various metrics such as Adjacent Channel Leakage Ratio (ACLR), which is commonly used in CDMA. Matching circuit 522 may be designed and operated to improve linearity of the amplifiers to the extent possible.

Figure 8:
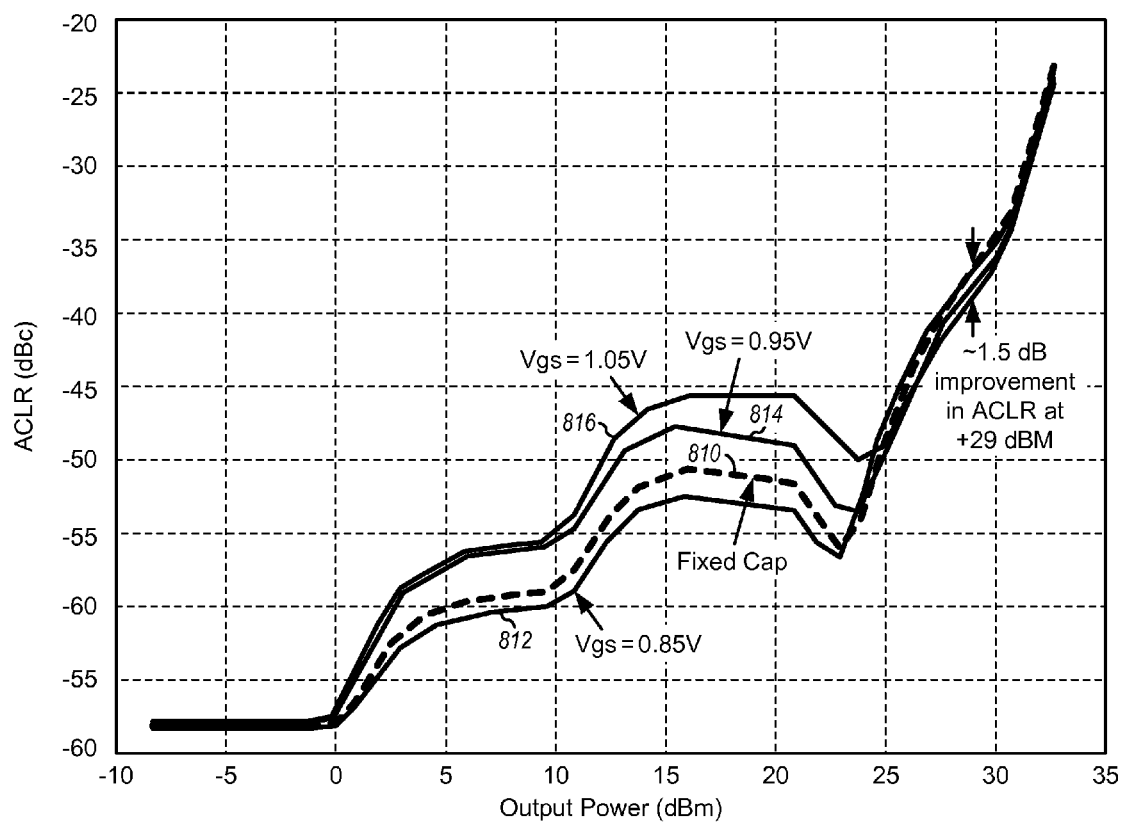
FIG. 8 shows nonlinear performance of the PA module in FIG. 6.

FIG. 8 shows exemplary plots of ACLR versus output power (Pout) of power amplifier 530 with variable matching circuit 522. Computer simulation was performed, and ACLR of the RFout signal from power amplifier 530 was measured for different Vbias2 voltages applied to PMOS transistor 542 in matching circuit 522. In FIG. 8, the horizontal axis denotes the output power of power amplifier 530 and is given in units of decibel relative to milliWatt (dBm). The vertical axis denotes ACLR and is given in units of decibel below carrier (dBc).

A plot 810 shows ACLR versus output power with only fixed capacitor 540 and no PMOS transistor 542 in matching circuit 522. Plots 812, 814 and 816 show ACLR versus output power with both fixed capacitor 540 and PMOS transistor 542 in matching circuit 522 for Vgs voltages of 0.85, 0.95 and 1.05 Volts for PMOS transistor 542. As shown in FIG. 8, an improvement of approximately 1.5 dB in ACLR may be obtained at +29 dBm output power with a Vgs voltage of 1.05 Volts for PMOS transistor 542. An improvement in ACLR may also be obtained at less than +23 dBm output power with a Vgs voltage of 0.85 Volts for PMOS transistor 542.

In an exemplary design, different Vbias2 voltages may be applied to PMOS transistor 542 for different ranges of output power levels. For the example shown in FIG. 8, one Vbias2 voltage may be used for +23 dBm or lower output power, and another Vbias2 voltage may be used for +23 dBm or more output power. In general, any number of Vbias2 voltages may be used for any number of ranges of output power levels. A specific Vbias2 voltage may be used for each range of output power levels and may be selected to achieve the lowest ACLR possible and/or based on other criteria. In another exemplary design, a single Vbias2 voltage may be used for all output power levels.

In an exemplary design, an apparatus (e.g., a wireless device, an integrated circuit, etc.) may comprise a variable matching circuit and a power amplifier (e.g., variable matching circuit 520 and power amplifier 530 in FIG. 5). The power amplifier may receive and amplify an input RF signal and provide an output RF signal. The variable matching circuit may be coupled to the power amplifier and may match a fixed impedance at the input of the variable matching circuit to a variable impedance at the input of the power amplifier in order to improve the linearity of the power amplifier. The variable impedance at the input of the power amplifier may be due to variable input capacitance of the power amplifier versus power level of the input RF signal.

The apparatus may further comprise a driver amplifier coupled to the variable matching circuit. The driver amplifier may receive and amplify a first RF signal and provide a second RF signal to the variable matching circuit. The fixed impedance at the input of the variable matching circuit may be equal to a target output impedance of the driver amplifier.

In an exemplary design, the power amplifier may comprise a first transistor (e.g., an NMOS transistor) of a first type. The variable matching circuit may comprise a second transistor (e.g., a PMOS transistor) of a second type that is different from the first type. The first and second transistors may each have input capacitance that varies with power level of the input RF signal. The first transistor may have a first CV curve, and the second transistor may have a second CV curve that is reversed of the first CV curve. This may allow the variable matching circuit to compensate for the variable input capacitance of the first transistor In an exemplary design, the variable matching circuit may comprise an inductor and a variable capacitor, e.g., as shown in FIG. 6. The inductor may be coupled between the input and output of the variable matching circuit. The variable capacitor may be coupled between the input of the variable matching circuit and circuit/AC ground. The variable capacitor may comprise the second transistor of the second type. The variable capacitor may further comprise a fixed capacitor coupled in parallel with the second transistor (e.g., as shown in FIG. 6) or in series with the second transistor.

The second transistor may have (i) a gate that receives a first bias voltage applied to a gate of the first transistor and (ii) a drain and a source that receive a second bias voltage. The second bias voltage may be (i) a fixed voltage selected to obtain good linearity for the power amplifier or (ii) a variable voltage that may be set based on the power level of the input RF signal.

In an exemplary design, an integrated circuit may comprise a driver amplifier, a variable matching circuit, and a power amplifier (e.g., as shown in FIGS. 5 and 6). The driver amplifier may receive and amplify a first RF signal and provide a second RF signal. The variable matching circuit may be coupled between the driver amplifier and the power amplifier and may receive the second RF signal and provide a third RF signal. The power amplifier may receive and amplify the third RF signal and provide a fourth RF signal. The variable matching circuit may match a fixed impedance at the output of the driver amplifier to a variable impedance at the input of the power amplifier in order to improve the linearity of the driver amplifier and the power amplifier.

In an exemplary design, the power amplifier may comprise a first transistor (e.g., an NMOS transistor) of a first type, and the variable matching circuit may comprise a second transistor (e.g., a PMOS transistor) of a second type that is different from the first type. In an exemplary design, the variable matching circuit may comprise an inductor and a variable capacitor. The inductor may be coupled between the input and output of the variable matching circuit. The variable capacitor may be coupled between the input of the variable matching circuit and circuit/AC ground. The variable capacitor may comprise a fixed capacitor and the second transistor coupled in parallel. The second transistor may provide variable capacitance versus power level of the third RF signal.

Figure 9:
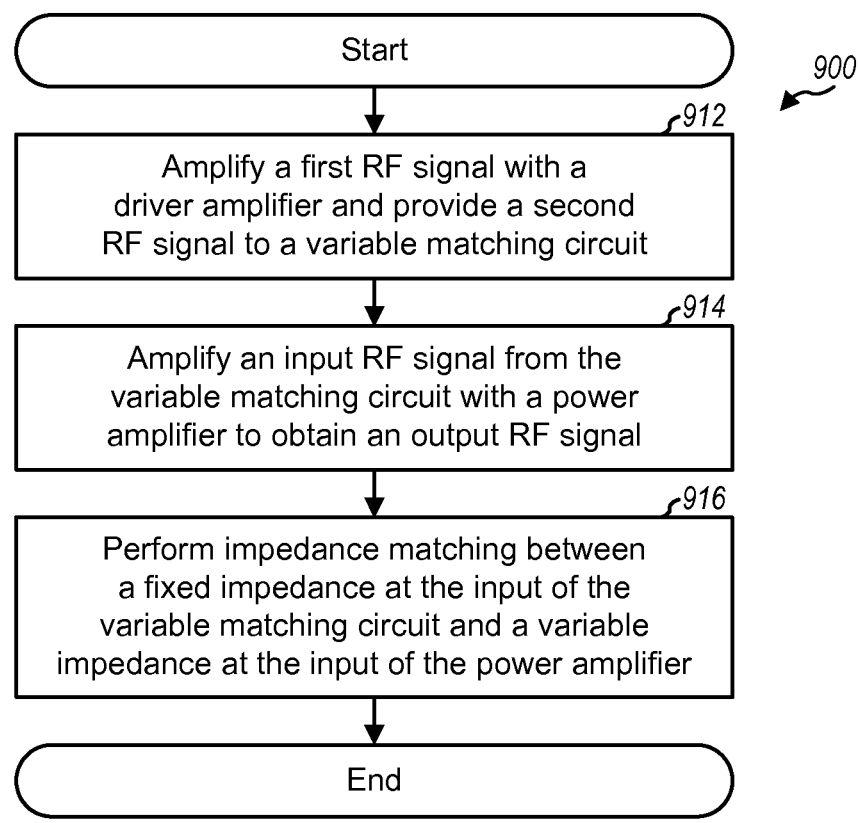
FIG. 9 shows a process for performing signal amplification.

FIG. 9 shows an exemplary design of a process 900 for performing signal amplification. A first RF signal may be amplified with a driver amplifier to obtain a second RF signal for a variable matching circuit coupled to the driver amplifier (block 912). An input RF signal from the variable matching circuit may be amplified with a power amplifier to obtain an output RF signal (block 914). Impedance matching may be performed between a fixed impedance at the input of the variable matching circuit (or the output of the driver amplifier) and a variable impedance at the input of the power amplifier (block 916).

The input RF signal may be amplified with a first transistor in the power amplifier. Impedance matching may be performed by varying the capacitance of a second transistor in the variable matching circuit to compensate for changes in the capacitance of the first transistor versus power level of the input RF signal. A bias voltage of the second transistor may be adjusted based on power level of the input RF signal to improve the linearity of the amplifiers.

The amplifiers and variable matching circuits described herein may be implemented on an IC, an analog IC, an RFIC, a mixed-signal IC, an ASIC, a printed circuit board (PCB), an electronic device, etc. The amplifiers and variable matching circuits may also be fabricated with various IC process technologies such as complementary metal oxide semiconductor (CMOS), NMOS, PMOS, bipolar junction transistor (BJT), bipolar-CMOS (BiCMOS), silicon germanium (SiGe), gallium arsenide (GaAs), etc.

An apparatus implementing the amplifiers and variable matching circuits described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:
1. An apparatus comprising:
   a power amplifier to receive and amplify an input radio frequency (RF) signal and provide an output RF signal; and
   a variable matching circuit including a shunt variable capacitor having a fixed capacitor and a transistor, the variable matching circuit coupled to the power amplifier and to match a fixed impedance at an input of the variable matching circuit to a variable impedance at an input of the power amplifier, an input capacitance of the transistor varying inversely proportional to a power level of the input RF signal.
2. The apparatus of claim 1, the variable impedance at the input of the power amplifier is due to variable input capacitance of the power amplifier versus power level of the input RF signal.
3. The apparatus of claim 1, further comprising:
   a driver amplifier coupled to the variable matching circuit and to receive and amplify a first RF signal and provide a second RF signal to the variable matching circuit.
4. The apparatus of claim 3, the fixed impedance at the input of the variable matching circuit is equal to a target output impedance of the driver amplifier.
5. The apparatus of claim 1, the power amplifier comprises another transistor of a first type, and the transistor of the shunt variable capacitor is a second type different from the first type.
6. The apparatus of claim 5, each of the transistor and the another transistor has an input capacitance that varies with power level of the input RF signal.
7. The apparatus of claim 5, the transistor has a first capacitance-to-voltage (CV) curve, and the another transistor has a second CV curve that is reversed of the first CV curve.
8. The apparatus of claim 5, the another transistor comprises an N-channel metal oxide semiconductor (NMOS) transistor, and the transistor comprises a P-channel metal oxide semiconductor (PMOS) transistor.
9. The apparatus of claim 1, the variable matching circuit comprises
   an inductor coupled between the input of the variable matching circuit and an output of the variable matching circuit, and
   the shunt variable capacitor coupled between the input of the variable matching circuit and circuit ground.
10. The apparatus of claim 9, the power amplifier comprises another transistor of a first type, and the transistor of the shunt variable capacitor is a second type different from the first type.
11. The apparatus of claim 10, the another transistor comprises an N-channel metal oxide semiconductor (NMOS) transistor, and the transistor comprises a P-channel metal oxide semiconductor (PMOS) transistor.
12. The apparatus of claim 10, the another transistor has a gate receiving a first bias voltage applied to a gate of the transistor and the transistor further has a drain and a source receiving a second bias voltage.
13. The apparatus of claim 12, the second bias voltage is variable and set based on power level of the input RF signal.
14. An integrated circuit comprising:
   a driver amplifier to receive and amplify a first radio frequency (RF) signal and provide a second RF signal;
   a power amplifier to receive and amplify a third RF signal and provide a fourth RF signal; and a variable matching circuit including a shunt variable capacitor having a fixed capacitor and a transistor, the variable matching circuit coupled between the driver amplifier and the power amplifier and to receive the second RF signal and provide the third RF signal, the variable matching circuit matches a fixed impedance at an output of the driver amplifier to a variable impedance at an input of the power amplifier, an input capacitance of the transistor varying inversely proportional to a power level of the input RF signal.

15. The integrated circuit of claim 14, the power amplifier comprises an N-channel metal oxide semiconductor (NMOS) transistor, and the transistor of the shunt variable capacitor comprises a P-channel metal oxide semiconductor (PMOS) transistor.

16. The integrated circuit of claim 14, the variable matching circuit comprising:
an inductor coupled between an input of the variable matching circuit and an output of the variable matching circuit, and
the shunt variable capacitor coupled between the input of the variable matching circuit and circuit ground.

17. The integrated circuit of claim 16, wherein the shunt variable capacitor in the variable matching circuit comprising the fixed capacitor and the transistor are coupled in parallel, the transistor providing variable capacitance versus power level of the third RF signal.

18. A method of signal amplification, comprising:
amplifying an input radio frequency (RF) signal with a power amplifier to obtain an output RF signal; and
performing impedance matching between a fixed impedance at an input of a variable matching circuit and a variable impedance at an input of the power amplifier, the variable matching circuit including a shunt variable capacitor having a fixed capacitor and a transistor having an input capacitance varying inversely proportional to a power level of the input RF signal.

19. The method of claim 18, further comprising:
amplifying a first RF signal with a driver amplifier and providing a second RF signal to the variable matching circuit.

20. The method of claim 18, the amplifying the input RF signal comprises amplifying the input RF signal with another transistor in the power amplifier, and the performing impedance matching comprises varying capacitance of the transistor in the variable matching circuit to compensate for changes in capacitance of the another-transistor versus power level of the input RF signal.

21. The method of claim 20, further comprising:
adjusting a bias voltage of the transistor based on power level of the input RF signal.

22. An apparatus comprising:
means for power amplifying an input radio frequency (RF) signal to obtain an output RF signal; and
means for performing impedance matching between a fixed impedance at an input of the means for performing impedance matching and a variable impedance at an input of the means for power amplifying, the means for performing impedance matching including a shunt variable capacitor having a fixed capacitor and a transistor having an input capacitance varying inversely proportional to a power level of the input RF signal.

* * * * *